(12) United States Patent
Tsai et al.

(10) Patent No.: US 9,449,941 B2
(45) Date of Patent: Sep. 20, 2016

(54) CONNECTING FUNCTION CHIPS TO A PACKAGE TO FORM PACKAGE-ON-PACKAGE

(75) Inventors: Pei-Chun Tsai, Zhongli (TW); Sheng-Yu Wu, Hsin-Chu (TW); Ching-Wen Hsiao, Banqiao (TW); Tin-Hao Kuo, Hsin-Chu (TW); Chen-Shien Chen, Zhubei (TW); Chung-Shi Liu, Hsin-Chu (TW); Chien-Hsiun Lee, Hsin-Chu (TW); Mirng-Ji Lii, Sinpu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 32 days.

(21) Appl. No.: 13/178,161

(22) Filed: Jul. 7, 2011

(65) Prior Publication Data

US 2013/0009303 A1    Jan. 10, 2013

(51) Int. Cl.
*H01L 29/00* (2006.01)
*H01L 23/00* (2006.01)
(Continued)

(52) U.S. Cl.
CPC ........... *H01L 24/73* (2013.01); *H01L 25/0652* (2013.01); *H01L 25/0657* (2013.01); *H01L 25/18* (2013.01); *H01L 2224/131* (2013.01); *H01L 2224/13082* (2013.01); *H01L 2224/13147* (2013.01); *H01L 2224/16* (2013.01); *H01L 2224/16238* (2013.01); *H01L 2224/32145* (2013.01); *H01L 2224/32225* (2013.01); *H01L 2224/45124* (2013.01); *H01L 2224/45144* (2013.01); *H01L 2224/73203* (2013.01); *H01L 2224/73204* (2013.01); *H01L 2225/06517* (2013.01); *H01L 2225/06562* (2013.01);
(Continued)

(58) Field of Classification Search
CPC ................. H01L 2224/45144; H01L 2224/16
USPC .......................... 257/686, 777, 737, E23.068
See application file for complete search history.

(56) References Cited

U.S. PATENT DOCUMENTS

| 7,485,970 B2 | 2/2009 | Hsu et al. |
| 7,915,622 B2 | 3/2011 | Wang |

(Continued)

FOREIGN PATENT DOCUMENTS

| CN | 101661890 A | 3/2010 |
| JP | 2009054970 A | 3/2009 |

(Continued)

OTHER PUBLICATIONS

Zhang, Y., et al.,"Lead-Free Bumping and Its Challenges," IWLPC Conference Proceedings, Oct. 10, 2004, 8 pages.

*Primary Examiner* — Tran Tran
(74) *Attorney, Agent, or Firm* — Slater Matsil, LLP

(57) ABSTRACT

A package-on-package (PoP) comprises a substrate with a plurality of substrate traces, a first function chip on top of the substrate connected to the substrate by a plurality of bond-on-trace connections, and a second function chip on top of the first function chip, directly connected to the substrate. Another package-on-package (PoP) comprises: a substrate with a plurality of substrate traces, a first function chip on top of the substrate connected to the substrate by a plurality of solder mask defined (SMD) connections formed on SMD bonding pads connected to solder bumps, and a second function chip on top of the first function chip, directly connected to the substrate by a plurality of bond-on-trace connections.

19 Claims, 7 Drawing Sheets

(51) Int. Cl.
  *H01L 25/065* (2006.01)
  *H01L 25/18* (2006.01)
(52) U.S. Cl.
  CPC .......... *H01L2924/00014* (2013.01); *H01L 2924/1434* (2013.01); *H01L 2924/15311* (2013.01)

(56) References Cited

U.S. PATENT DOCUMENTS

| | | | |
|---|---|---|---|
| 8,149,585 B2 | 4/2012 | Kawano | |
| 8,357,563 B2* | 1/2013 | Chin et al. | 438/107 |
| 2002/0117743 A1 | 8/2002 | Nakatani et al. | |
| 2004/0256731 A1 | 12/2004 | Mao et al. | |
| 2004/0262774 A1 | 12/2004 | Kang et al. | |
| 2005/0104183 A1* | 5/2005 | Kuroda et al. | 257/686 |
| 2005/0179025 A1 | 8/2005 | Okuyama et al. | |
| 2005/0205981 A1* | 9/2005 | Yoshimura et al. | 257/686 |
| 2007/0161266 A1 | 7/2007 | Nishizawa | |
| 2008/0093717 A1* | 4/2008 | Huang et al. | 257/673 |
| 2008/0142976 A1 | 6/2008 | Kawano | |
| 2008/0150157 A1* | 6/2008 | Nishimura et al. | 257/777 |
| 2008/0164620 A1* | 7/2008 | Lin et al. | 257/778 |
| 2008/0233676 A1* | 9/2008 | Tsai | 438/108 |
| 2009/0001542 A1* | 1/2009 | Kim | 257/686 |
| 2009/0057862 A1 | 3/2009 | Ha et al. | |
| 2009/0057917 A1 | 3/2009 | Takaike | |
| 2010/0237482 A1 | 9/2010 | Yang et al. | |
| 2011/0062592 A1 | 3/2011 | Lee et al. | |
| 2011/0186960 A1 | 8/2011 | Wu et al. | |
| 2011/0215458 A1* | 9/2011 | Camacho et al. | 257/686 |
| 2012/0267777 A1* | 10/2012 | Haba et al. | 257/737 |
| 2012/0326296 A1* | 12/2012 | Choi et al. | 257/737 |
| 2013/0009303 A1 | 1/2013 | Tsai et al. | |

FOREIGN PATENT DOCUMENTS

| | | |
|---|---|---|
| KR | 20090011198 A | 2/2009 |
| TW | I236721 | 6/1993 |
| TW | 201037800 A1 | 10/2010 |

* cited by examiner

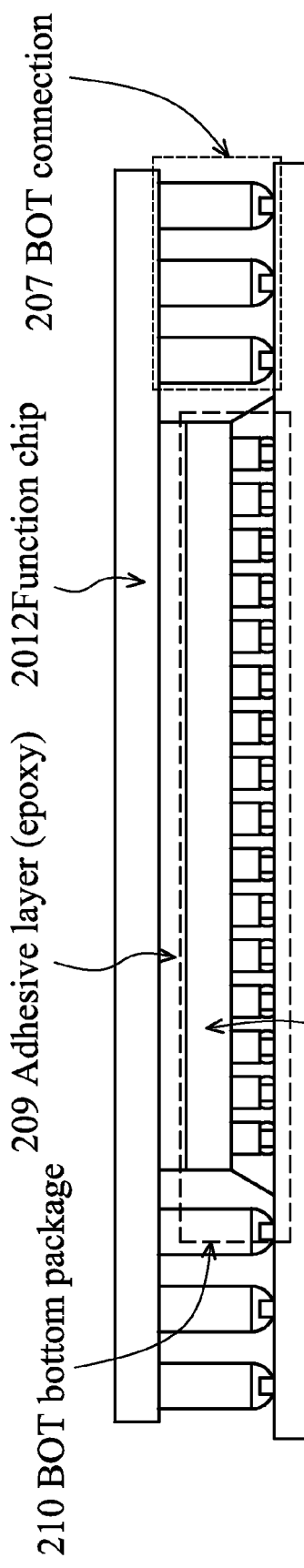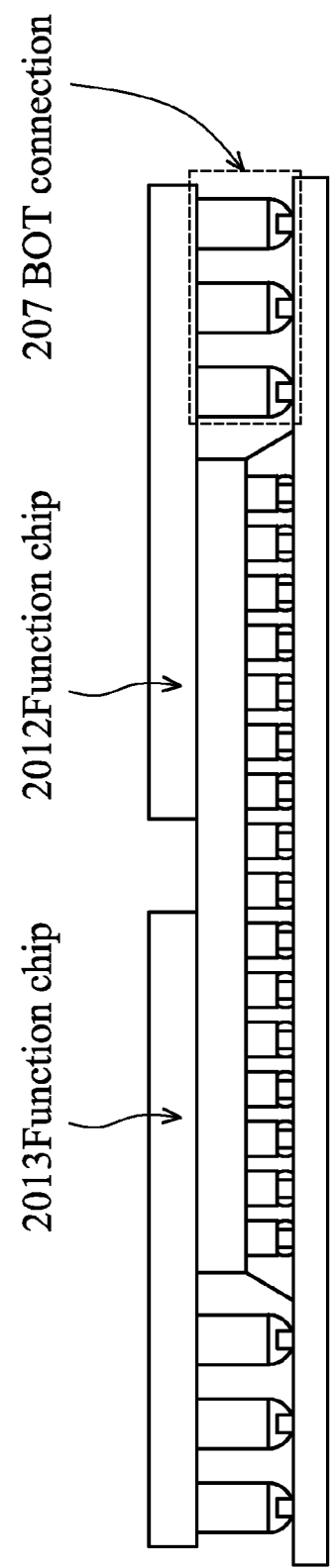
Figure 1(f)
Figure 1(g)

US 9,449,941 B2

CONNECTING FUNCTION CHIPS TO A PACKAGE TO FORM PACKAGE-ON-PACKAGE

BACKGROUND

Electronics can be divided into a simple hierarchy consisting of devices such as integrated circuit (IC) chips, packages, printed circuit boards (PCB) and a system. The package is the interface between an electronic device such as a computer chip, and a PCB. Devices are made from semiconductor materials such as silicon. Integrated circuits are assembled into a package such as a quad flat pack (QFP), pin grid array (PGA), or ball grid array (BGA), using wire bonding (WB), tape automated bonding (TAB), or flip chip(FC) bumping assembly techniques. The packaged device is then attached either directly to a printed wiring board or to another type of substrate, which is defined as the second level of packaging.

Ball grid array (BGA) packaging technology is an advanced semiconductor packaging technology, which is characterized in that a semiconductor chip is mounted on a front surface of a substrate, and a plurality of conductive elements such as solder balls are arranged in a matrix array, customarily referred to as ball grid array, on a back surface of the substrate. The ball grid array allows the semiconductor package to be bonded and electrically connected to an external PCB or other electronic devices. The BGA package may be employed in a memory such as Dynamic Random Access Memory and others.

A basic flip-chip (FC) packaging technology comprises an IC, an interconnect system, and a substrate. A function chip is connected to the substrate with a plurality of solder bumps, wherein the solder bumps forming a metallurgical interconnection between the chip and the substrate. The function chip, the solder bump, and the substrate form a flip-chip package. Further, a plurality of balls form a ball grid array (BGA).

Wire bonding can be used to make the electrical connections from chip components such as chip resistors or chip capacitors to substrate. Two function chips and are stacked on top of a plurality of substrate layers. The chips are connected to the substrate by a plurality of bonding gold wires. Other form of wires such as aluminum wire can be used too. The function chips, the gold wire, and the substrate form a wire bonding (WB) package.

Package on Package (PoP) is an integrated circuit packaging technique to allow vertically combining discrete logic and memory ball grid array (BGA) packages. Two or more packages are installed on top of one another, i.e. stacked, with a standard interface to route signals between them. This allows higher density, for example in the mobile telephone/PDA market.

Standard POP structures are based on stacked chips connected to substrate by wire bond or flip chip to form a package. Such PoP structures have a large package size due to wire bond connection and solder bump bridges. Also, package mechanical strength is weak due to wire bond connection.

BRIEF DESCRIPTION OF THE DRAWINGS

For a more complete understanding of the present invention, and the advantages thereof, reference is now made to the following descriptions taken in conjunction with the accompanying drawing, in which:

FIG. 1 (b) is a schematic view of an illustrative embodiment of a bottom bond-on-trace (BOT) package.

FIGS. 1 (d)-(g) are schematic views of illustrative embodiments of one or more function chips on top of a BOT package, in various positions with different connections and intermediate layers.

Figure 1A:
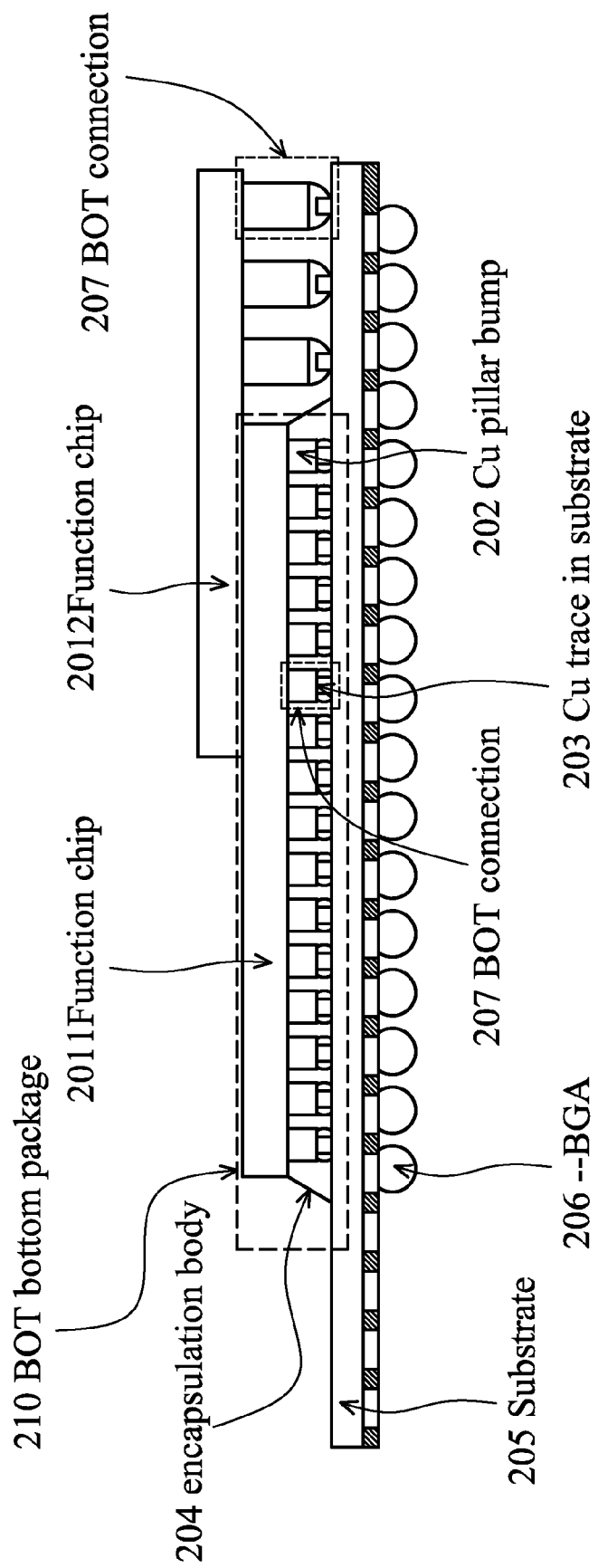
FIG. 1 (a) is a schematic view of an illustrative embodiment of a function chip on top of a bottom board-on-trace (BOT) package.
FIG. 1(c) is a schematic view of an illustrative embodiment of a Bond-on-trace (BOT) connection.
Figure 1B:
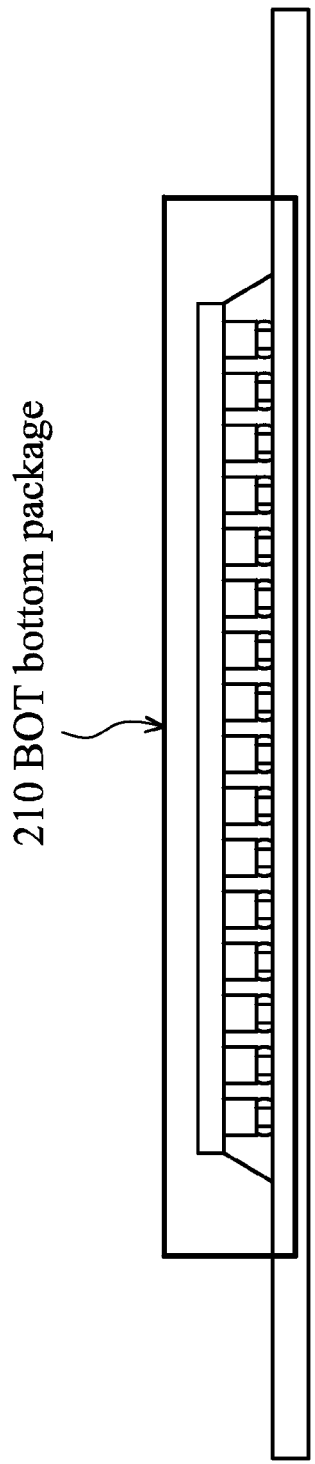

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and forming of the present exemplary embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely one or more function chips on top of bond-on-trace packages, and methods of forming the same.

FIG. 1 (a) is a schematic view of an illustrative embodiment of a function chip on top of a bottom bond-on-trace (BOT), sometimes referred to as bump-on-trace, package. A substrate 205 has a plurality of substrate traces 203 made of Cu at the top surface of the substrate 205. There may be a plurality of layers of substrates 205. The two layers of substrate shown in FIG. 1(a) are only for illustrative purpose and are not limiting. A plurality of balls 206 under the substrate 205 form a ball grid array (BGA). A first function chip 2011 is placed on top of the substrate 205 and is connected to the substrate by a plurality of bond-on-trace (BOT) connections 207. Details of a BOT connection are shown in FIG. 1(c). The space between the first function chip 2011 and the substrate 205 is filled with a compound to fill the space between the chip 2011. BOT connections 207 and the substrate 205, form an encapsulation body 204. The function chip 2011, the substrate 205 with its substrate traces 203, and the plurality of BOT connections 207 form a bottom BOT package 210.

A second function chip 2012 is further placed on top of the bottom BOT package 210 by placing the second function chip on top of the first function chip 2011 of the BOT package 210. Therefore the second function chip 2012 does not need its own package substrate, instead it shares the substrate with the bottom package BOT package 210. Furthermore, the first function chip and the second function chip may have different functions, e.g., memory chips such as Dynamic Random Access Memory chips (DRAM), or a control chips, etc. The second function chip 2012 has a part directly overlapping the first function chip 2011, and it has a second part that is not over 2011 so that the second part can be directly connected to the substrate 205, as shown by 207

BOT connections in FIG. 1(a), or by other ways to directly connect the function chip 2012 to the substrate 205. This illustrative arrangement combines a function chip 2012 connected with a substrate directly and placed on top of a BOT bottom package 210. Top layer function chip 2012 could be one or several function chips (shown later in FIG. 1(g)) that are not in package form. The advantage of such an arrangement is to build multi-function chips together in minimum package size, low cost, increase total package mechanical strength, and being scalable for fine bump pitch with high stand-off. The size of the function chips, and the relative positions of each other, in addition to the number of traces, and the number of BOT connections are only for illustrative purposes and are not limiting. Those of skill in the art will readily recognize that there are many other variations.

FIG. 1 (b) is a detailed schematic view of an illustrative embodiment of a bottom bond-on-trace (BOT) package 210 forming part of the structure in FIG. 1(a). The BOT package 210 comprises a substrate 205, a plurality of substrate traces 203 on top of the surface of the substrate 205, wherein a trace is connected to a Cu pillar bump 202 (FIG. 1(a)), which is further connected to a function chip 2011. The space between the first function chip 2011 and the substrate 205 is filled with a compound to fill the space between the chip 2011. BOT connections 207 and the substrate 205 form an encapsulation body 204. All the above components 205, 203, 202, 2011, 207, and 204 form a BOT package 210.

Figure 1C:
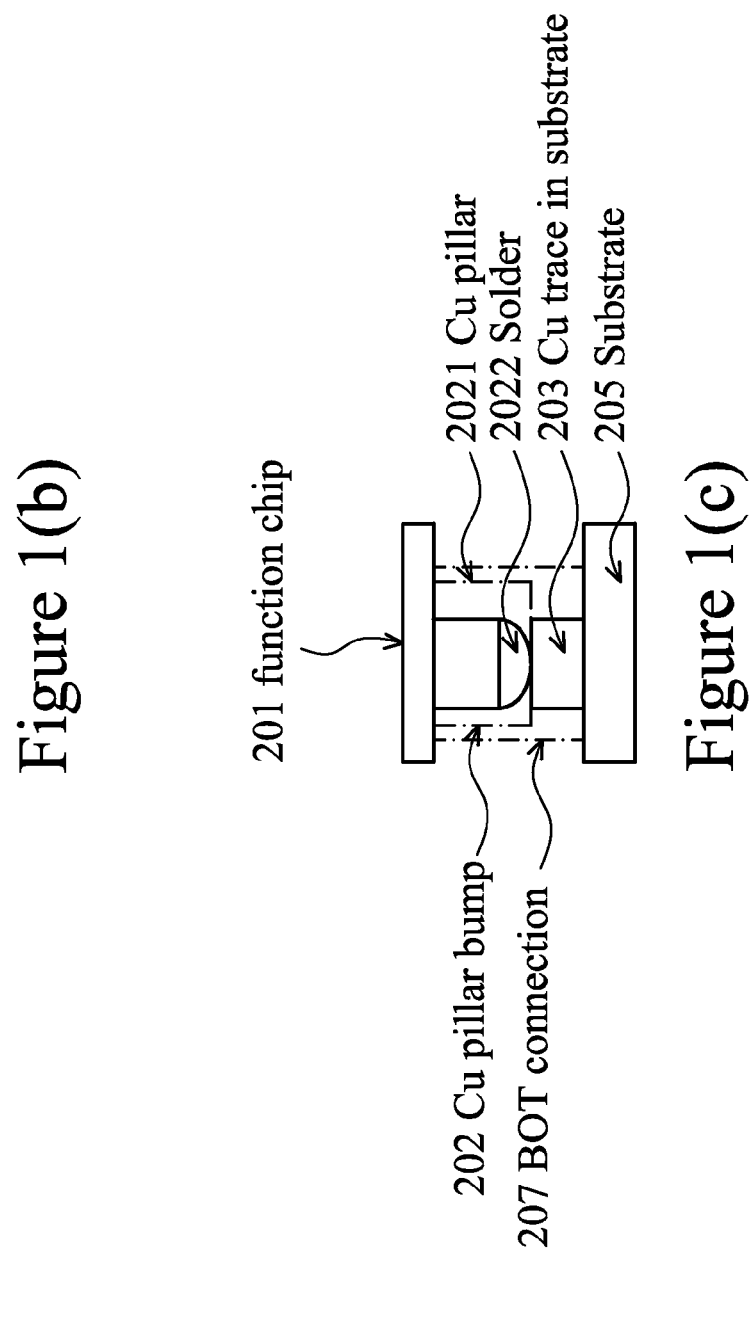

FIG. 1(c) is a schematic view of an illustrative embodiment of a Bond-on-trace (BOT) connection. A trace 203 on top of a surface of a substrate 205, is connected to a Cu pillar bump 202, which is further connected to a function chip 201. The Cu pillar bump is formed by a Cu pillar 2021 connected with a solder bump 2022. In short, a BOT connection is composed of a solder bump on a Cu pillar. The structures shown in FIG. 1(c) are only for illustrative purpose and are not limiting. Additional embodiments can be conceived, e.g., the Cu pillar may be other metals with a melting temp higher than 300° C. Furthermore, the plurality of substrate traces can be covered by a metal finish, such as a layer of organic film or a mix material such as Ni/Pd/Au, coated on substrate trace.

Figure 1D:
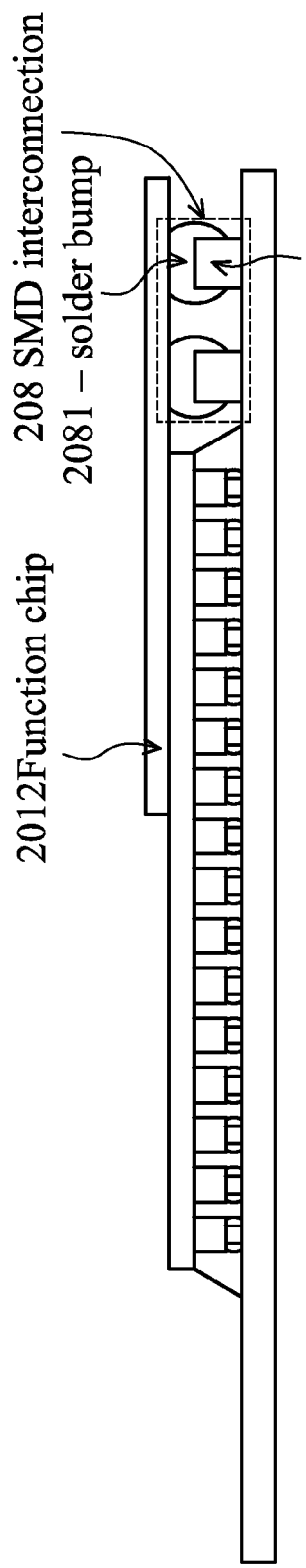

The second function chip 2012 in FIG. 1(a) can be directly connected to the substrate 205 by way of BOT connections as shown in FIG. 1(a). Furthermore, the second function chip 2012 may be directly connected to the substrate 205 by a plurality of solder mask defined (SMD) bonding pads connected to solder bumps, as shown in FIG. 1(d). A plurality of SMD connections are shown in FIG. 1(d), where a SMD connection 208 comprises a solder bump 2081 connected to a SMD pad 2082 which is on top of the surface of the substrate 205. The solder mask defined pads in a substrate usually have pre-solder on the substrate trace to improve connection.

Figure 1E:
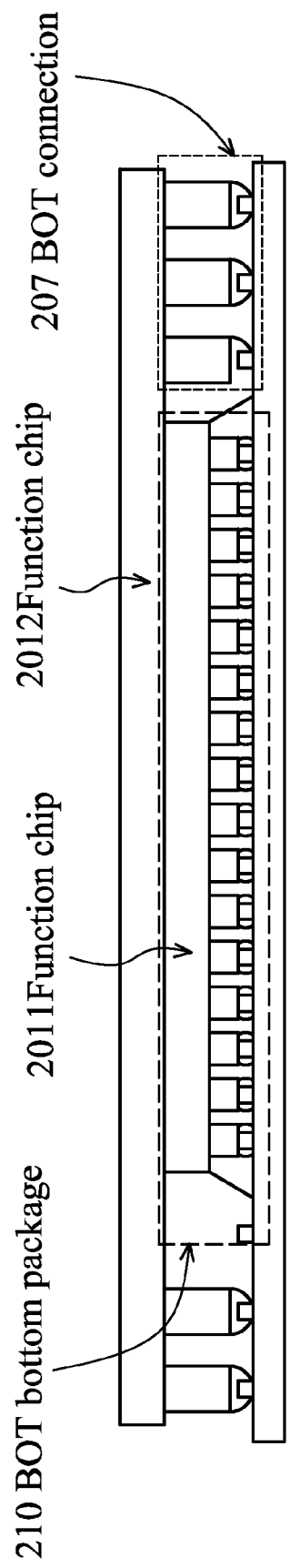
Figure 2A:
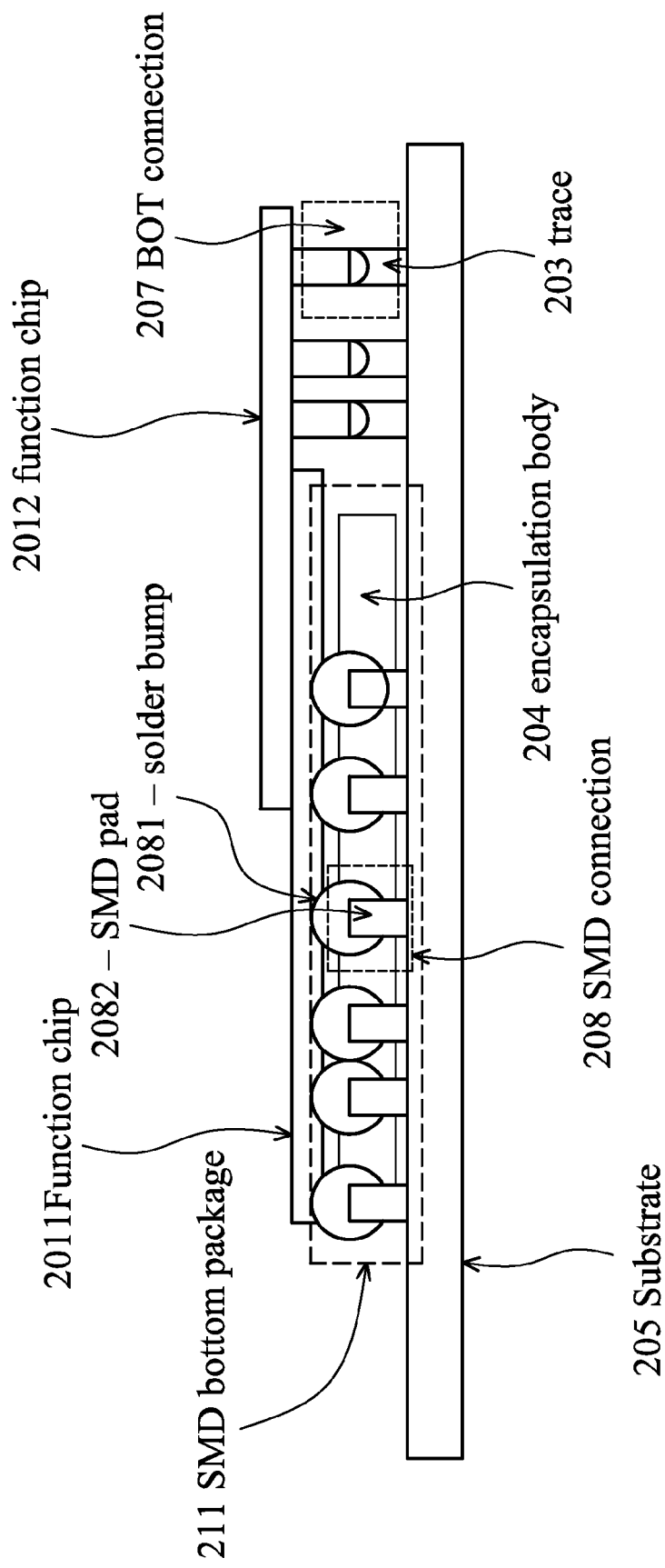
FIGS. 2 (a)-(e) are schematic views of illustrative embodiments of one function chip or more on top of a Solder Mask defined (SMD) package, in various positions with BOT connections to the substrate and intermediate layers.
Figure 2B:
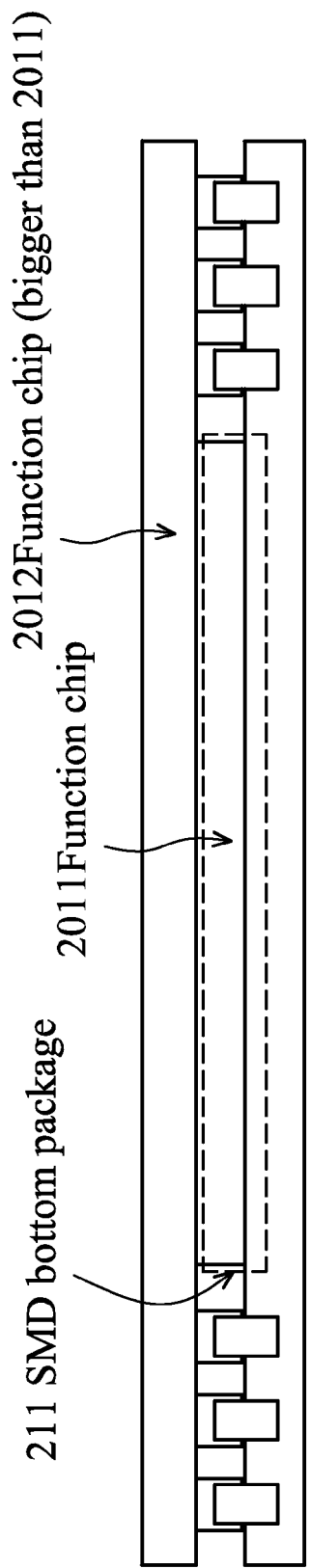
Figure 2C:
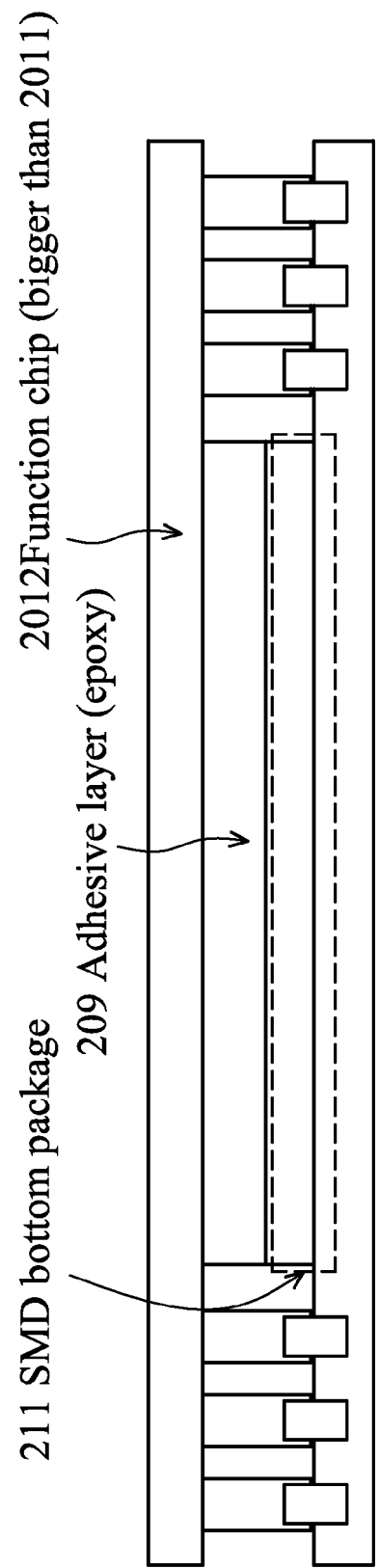
Figure 2D:
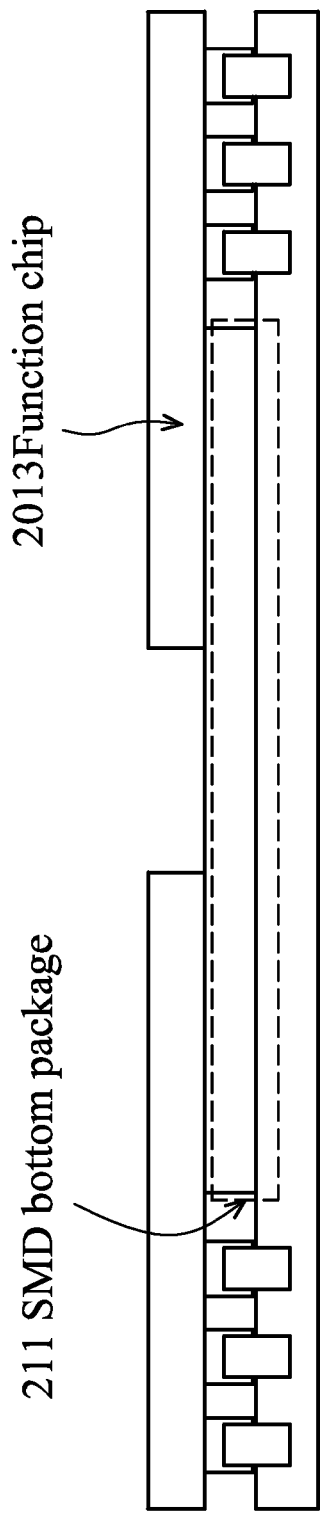
Figure 2E:
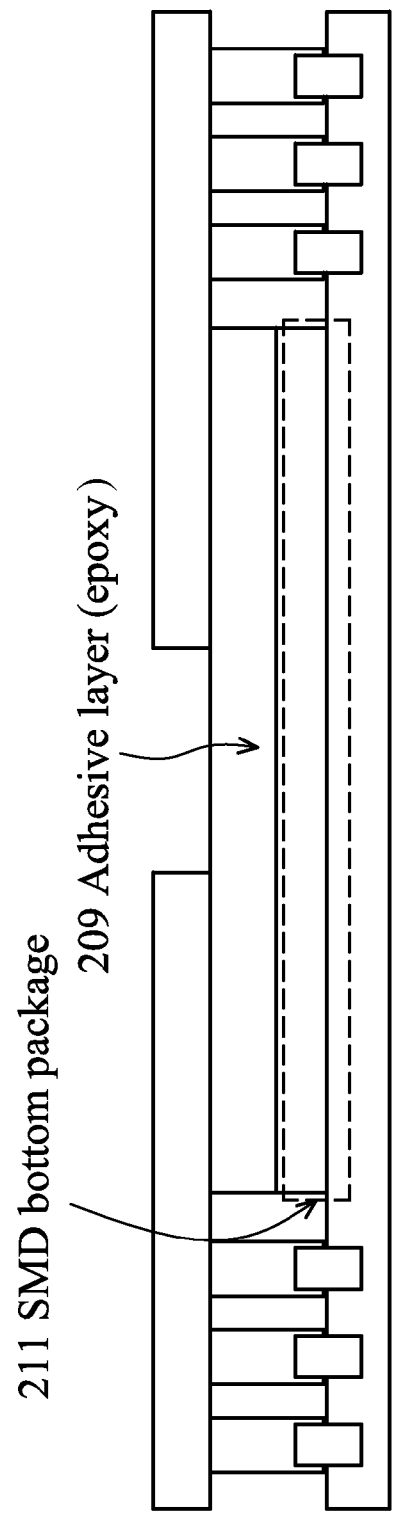

FIG. 1(e) is a schematic view of an illustrative embodiment of a second function chip 2012 on top of a bottom bond-on-trace (BOT) package 210. The second function chip 2012 is directly connected to the substrate of the bottom BOT package by way of BOT connections 207. Furthermore, the second function chip 2012 is of a bigger size than the first function chip 2011 so that the second function chip 2012 covers the entire surface of the first function chip 2011, and the second function chip 2012 is directly connected from two or more sides that extend beyond the covered first function chip 2011. The number of BOT connections shown in FIG. 1(e) is only for illustrative purpose, and are not limiting. There could be more than 2 or 3 BOT connections shown in FIG. 1(e). Furthermore, the direct connection between the second function chip 2012 with the substrate 205 can be of SMD type as shown in FIG. 1(d), rather than the BOT connection as shown in FIG. 1(e).

FIG. 1(f) is a schematic view of an illustrative embodiment of a second function chip 2012 on top of a bottom bond-on-trace (BOT) package 210, further comprising an intermediate epoxy layer 209 between the first function chip 2011 and the second function chip 2012, connected to both function chips. The epoxy layer 209 shown here is only for illustrative purpose, and is not limiting. The epoxy layer 209 can be further applied to other structures shown in FIG. 1(a), FIG. 1(c), or many other variations. Other adhesive layers could be used in place of the epoxy layer as well.

FIG. 1(g) is a schematic view of an illustrative embodiment of a second function chip 2012 on top of a bottom bond-on-trace (BOT) package 210, further comprising a third function chip 2013 on top of the first function chip 2011. The third function chip 2013 is directly connected to the substrate as well. FIG. 1(g) shows that the third function chip 2013 is directly connected to the substrate 205 by a plurality of BOT connections. Furthermore, SMD connections can be used to connect the third function chip 2013 or the second function chip 2012 to the substrate 205 as well. Furthermore, there may be an epoxy intermediate layer between the first function chip, and the second and third function chips respectively (not shown). Those of skill in the art will readily recognize that there are many other variations.

More than two function chips can be further added on top of the bottom BOT package 210 by placing the multiple function chips on top of the first function chip 2011 and directly connecting the multiple function chips to the substrate (not shown). Those of skill in the art will readily recognize that there are many other variations.

For all the illustrative embodiments shown in FIGS. 2(a)-(g), the bottom package is a BOT package wherein the first function chip is connected to a substrate by a plurality of BOT connections. Furthermore, other connections can be used to form the bottom package, e.g., a plurality of SMD connections can be used to form the bottom package connecting a first function chip to a substrate.

FIG. 2 (a) is a schematic view of an illustrative embodiment of a function chip on top of a bottom SMD package. Embodiments shown in FIGS. 2(a)-2(e) all have a bottom SMD package, in comparison with embodiments shown in FIGS. 1(a)-(g) all have a BOT bottom package. A substrate 205 has a plurality of substrate traces 203 made of Cu at the top surface of the substrate 205. There may be a plurality of layers of substrates 205 (not shown). A first function chip 2011 is placed on top of the substrate 205 and is connected to the substrate by a plurality of SMD connections 208. Details of the SMD connection are shown in FIG. 1(d), wherein a SMD connection comprises a SMD pad 2082 on top of the substrate connected to a solder bump 2081. The space between the first function chip 2011 and the substrate 205 is filled with a compound to fill the space. SMD connections 208 and the substrate 205 form an encapsulation body 204. The function chip 2011, the substrate 205, together with the plurality of SMD connections 208, form a bottom SMD package 211.

A second function chip 2012 is further placed on top of the bottom SMD package 211 by placing the second chip 2012 on top of the first function chip 2011 of the SMD package 211. Therefore the second function chip 2012 does not have need its own package substrate, instead it shares the substrate with the bottom package SMD package 211. Furthermore, the first function chip and the second function chip may have different functions, e.g., memory chips such as Dynamic Random Access Memory chips (DRAM), or a control chips, etc. The second function chip 2012 has a part directly overlapping the first function chip 2011, and it has a second part that is not over 2011 so that the second part can be directly connected to the substrate 205, as shown by 207 BOT connections in FIG. 2(*a*). When the bottom package 211 is a SMD package, the second function chip 2012 is to be connected to the substrate 205 directly by a plurality of BOT connections, which comprise a plurality of connections formed by a solder bump on a Cu pillar landed on a substrate trace without pre-solder. Furthermore, the Cu pillar could be other metals which melting temperature higher than 300° C.

This illustrative arrangement combines a function chip 2012 connected with a substrate directly and it is placed on top of a SMD bottom package 211. Top layer function chip 2012 could be one or several function chips (shown later in FIG. 2(*d*)) and are not in package form. The advantage of such an arrangement is to built multi-function chips together in minimum package size, low cost, increase total package mechanical strength, and being scalable for fine bump pitch with high stand-off. The size of the function chips, and the relative positions of each other, in addition to the number of substrate traces, and the number of SMD and BOT connections are only for illustrative purposes and are not limiting. Those of skill in the art will readily recognize that there are many other variations.

FIG. 2(*b*) is a schematic view of an illustrative embodiment of a second function chip 2012 on top of a bottom SMD package 211. The second function chip 2012 is directly connected to the substrate of the bottom SMD package by way of BOT connections 207. Furthermore, the second function chip 2012 is of a bigger size than the first function chip 2011 so that the second function chip 2012 covers the entire surface of the first function chip 2011, and the second function chip 2012 is directly connected from all sides that extend beyond the covered first function chip 2011. The number of BOT connections shown in FIG. 2(*b*) is only for illustrative purpose, and are not limiting. There could be more than 2 or 3 BOT connections shown in FIG. 2(*b*).

FIG. 2(*c*) is a schematic view of an illustrative embodiment of a second function chip 2012 on top of a bottom SMD package 211, further comprising an intermediate epoxy layer 209 in the middle of the first function chip 2011 and the second function chip 2012, connected to both function chips. The epoxy layer 209 shown here is only for illustrative purpose, and is not limiting. The epoxy layer 209 can be further applied to other structures shown in FIG. 2(*a*), or FIG. 2(*d*), or many other variations.

FIG. 2(*d*) is a schematic view of an illustrative embodiment of a second function chip 2012 on top of a bottom SMD package 211, further comprising a third function chip 2013 on top of the first function chip 2011. The third function chip 2013 is directly connected to the substrate as well. FIG. 2(*d*) shows that the third function chip 2013 is directly connected to the substrate 205 by a plurality of BOT connections. Furthermore, there may be an epoxy intermediate layer between the first function chip, and the layer of second and third function chips, as shown in FIG. 2(*e*). Those of skill in the art will readily recognize that there are many other variations.

More than two function chips can be further added on top of the bottom SMD package 211 by placing the multiple function chips on top of the first function chip 2011 and directly connecting the multiple function chips to the substrate (not shown). Those of skill in the art will readily recognize that there are many other variations.

A method of forming a package-on-package (PoP) comprises the following steps: connecting a first function chip on top of a substrate with a plurality of substrate traces to the substrate by a plurality of bond-on-trace connections; placing a second function chip on top of the first function chip; and directly connecting the second function chip to the substrate.

A method of forming a package-on-package (PoP) comprises the following steps: connecting a first function chip on top of a substrate with a plurality of substrate traces to the substrate by a plurality of solder mask defined (SMD) connections formed on SMD bonding pads connected to solder bumps; placing a second function chip on top of the first function chip; and directly connecting the second function chip to the substrate by a plurality of bond-on-trace connections.

What is claimed is:

1. A package-on-package (PoP) comprising:
   a substrate with a plurality of substrate traces;
   a first function chip on top of the substrate connected to the substrate by a first plurality of connections, wherein the first plurality of connections comprises solder bumps connected to the substrate by a plurality of solder mask defined (SMD) bonding pads on the surface of the substrate; and
   a second function chip on top of the first function chip, directly connected to the substrate by a plurality of bond-on-trace connectors on a bottom surface of the second function chip, wherein the plurality of bond-on-trace connectors are connected to the substrate without SMD bonding pads on the surface the substrate, wherein the second function chip has a first portion overlapping the first function chip and a second portion not overlapping the first function chip, and wherein the second function chip does not cover an entire surface of the first function chip.

2. The PoP of claim 1, wherein the plurality of bond-on-trace connections comprises solder bumps.

3. The PoP of claim 2, wherein each of the plurality of bond-on-trace connections is formed by a solder bump on a pillar connected to a substrate trace.

4. The PoP of claim 3, wherein the pillar comprises copper or another metal having a melting temperature higher than 300° C.

5. The PoP of claim 1, wherein the first function chip and the second function chip are configured to perform different functions.

6. The PoP of claim 1, wherein the plurality of substrate traces are covered by a metal finish, wherein the metal finish is a layer of organic film or a mixed material comprising nickel, palladium, gold, or a combination thereof.

7. The PoP of claim 1, further comprising an intermediate epoxy layer disposed between the first function chip and the second function chip, the intermediate epoxy layer being connected to both function chips.

8. The PoP of claim 1, further comprising a third function chip on top of the first function chip, directly connected to the substrate.

9. A package-on-package (PoP) comprising:
   a substrate with a plurality of substrate traces;
   a first function chip on top of the substrate connected to the substrate by a plurality of solder mask defined (SMD) connections formed on SMD bonding pads on a surface of the substrate connected to solder bumps; and a second function chip on top of the first function chip, directly connected to the substrate by a plurality of bond-on-trace connections on a bottom surface of the second function chip, wherein the plurality of bond-on-trace connections are connected to the substrate without SMD bonding pads on the surface the substrate, wherein the second function chip has a first portion overlapping the first function chip and a second portion not overlapping the first function chip, and wherein the second function chip does not cover an entire surface of the first function chip.

10. The PoP of claim 9, wherein the plurality of SMD connections between the first function chip and the substrate are surrounded by a compound for under fill to fill a space between the first function chip, solder bumps of the plurality of SMD connections, and the substrate.

11. The PoP of claim 9, wherein the plurality of bond-on-trace connections between the second function chip and the substrate comprise a plurality of connections, wherein each connection is formed by a solder bump on a pillar connected to a substrate trace.

12. The PoP of claim 11, wherein the pillar comprises copper or another metal having a melting temperature higher than 300° C.

13. The PoP of claim 9, wherein the first function chip and the second function chip are configured to perform different functions.

14. The PoP of claim 9, further comprising an intermediate epoxy layer disposed between the first function chip and the second function chip, the intermediate epoxy layer being connected to both function chips.

15. The PoP of claim 9, further comprising a third function chip on top of the first function chip, directly connected to the substrate by a plurality of bond-on-trace connections.

16. A package-on-package (PoP) comprising:
a substrate with a plurality of substrate traces;
a first function chip on top of the substrate and connected to the substrate by a plurality of bond-on-trace connections on a bottom surface of the first function chip, wherein the plurality of bond-on-trace connections is bonded to the substrate without solder mask defined (SMD) bonding pads on a surface of the substrate; and
a second function chip on top of the first function chip, directly connected to the substrate by a plurality of SMD bonding pads on the surface of the substrate connected to solder bumps on a bottom surface of the second function chip, wherein the second function chip has a first portion overlapping the first function chip and a second portion not overlapping the first function chip, and wherein the second function chip does not cover an entire surface of the first function chip.

17. The PoP of claim 16, wherein the plurality of bond-on-trace connections between the first function chip and the substrate comprise a plurality of connections, wherein each connection is formed by a solder bump on a pillar connected to a substrate trace.

18. The PoP of claim 8, wherein a top surface of the third function chip is substantially level with a top surface of the second function chip.

19. The PoP of claim 15, wherein a top surface of the third function chip is substantially level with a top surface of the second function chip.

* * * * *